(12) United States Patent
Obiya et al.

(10) Patent No.: US 10,340,971 B2
(45) Date of Patent: Jul. 2, 2019

(54) POWER AMPLIFICATION MODULE, FRONT-END CIRCUIT, AND COMMUNICATION DEVICE

(71) Applicant: Murata Manufacturing Co., Ltd., Kyoto (JP)

(72) Inventors: Hidenori Obiya, Kyoto (JP); Reiji Nakajima, Kyoto (JP); Shinya Hitomi, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 15/941,078

(22) Filed: Mar. 30, 2018

(65) Prior Publication Data
US 2018/0227008 A1    Aug. 9, 2018

Related U.S. Application Data

(63) Continuation of application No. PCT/JP2016/078808, filed on Sep. 29, 2016.

(30) Foreign Application Priority Data

Oct. 2, 2015  (JP) .................................. 2015-197198

(51) Int. Cl.
*H04B 1/04*     (2006.01)
*H04B 1/40*     (2015.01)
(Continued)

(52) U.S. Cl.
CPC ................. *H04B 1/40* (2013.01); *H03F 1/56* (2013.01); *H03F 3/19* (2013.01); *H03F 3/195* (2013.01);
(Continued)

(58) Field of Classification Search
CPC  H04B 1/40; H04B 2001/0408; H04B 1/0483; H03F 1/56; H03F 3/19;
(Continued)

(56) References Cited

U.S. PATENT DOCUMENTS

2011/0316637 A1* 12/2011 Pletcher ................ H03F 1/0277
                                                            330/310
2013/0163212 A1   6/2013 Tanaka et al.
(Continued)

FOREIGN PATENT DOCUMENTS

JP      2000-183664 A    6/2000
JP      2013-132015 A    7/2013
(Continued)

OTHER PUBLICATIONS

International Search Report for International Application No. PCT/JP2016/078808, dated Dec. 20, 2016.
(Continued)

*Primary Examiner* — Tuan Pham
(74) *Attorney, Agent, or Firm* — Pearne & Gordon LLP

(57) ABSTRACT

A PA module (10A) includes a previous stage amplification element (12) to amplify a high-frequency signal, a posterior stage amplification element (13) to amplify the high-frequency signal amplified by the previous stage amplification element (12), and a variable filter circuit arranged between the previous stage amplification element (12) and the posterior stage amplification element (13) to vary a pass band and an attenuation band in accordance with a frequency band of the high-frequency signal, in which the variable filter circuit includes a filter portion (16) and switches (14 and 15) to vary the pass band and the attenuation band of the variable filter circuit, and the previous stage amplification element (12) and at least a part of the switches (14 and 15) are formed in one chip using a chip A, the posterior stage
(Continued)

amplification element (13) are included in a second chip which is different from the chip A.

16 Claims, 9 Drawing Sheets

(51) Int. Cl.
  *H03F 3/195* (2006.01)
  *H04B 1/00* (2006.01)
  *H03F 1/56* (2006.01)
  *H03F 3/19* (2006.01)
  *H03F 3/24* (2006.01)
  *H03F 3/72* (2006.01)
  *H04B 1/18* (2006.01)
  *H04B 1/48* (2006.01)

(52) U.S. Cl.
  CPC ............... *H03F 3/245* (2013.01); *H03F 3/72* (2013.01); *H04B 1/00* (2013.01); *H04B 1/0057* (2013.01); *H04B 1/04* (2013.01); *H04B 1/0458* (2013.01); *H04B 1/18* (2013.01); *H04B 1/48* (2013.01); *H03F 2200/111* (2013.01); *H03F 2200/168* (2013.01); *H03F 2200/294* (2013.01); *H03F 2200/387* (2013.01); *H03F 2200/411* (2013.01); *H03F 2200/451* (2013.01); *H03F 2203/7209* (2013.01)

(58) Field of Classification Search
  CPC . H03F 3/195; H03F 3/245; H03F 3/72; H01B 1/00
  See application file for complete search history.

(56) References Cited

U.S. PATENT DOCUMENTS

2015/0119115 A1* 4/2015 Bagger ................ H04B 1/0057
  455/571
2016/0112009 A1 4/2016 Hitomi et al.

FOREIGN PATENT DOCUMENTS

WO 2013/150564 A1 10/2013
WO 2015/002127 A1 1/2015

OTHER PUBLICATIONS

Written Opinion for International Application No. PCT/JP2016/078808, dated Dec. 20, 2016.

* cited by examiner

POWER AMPLIFICATION MODULE, FRONT-END CIRCUIT, AND COMMUNICATION DEVICE

This is a continuation of International Application No. PCT/JP2016/078808 filed on Sep. 29, 2016 which claims priority from Japanese Patent Application No. JP2015-197198 filed on Oct. 2, 2015. The contents of these applications are incorporated herein by reference in their entireties.

BACKGROUND OF THE DISCLOSURE

Field of the Disclosure

The present disclosure relates to a power amplification module that amplifies a high-frequency signal, a front-end circuit, and a communication device.

Description of the Related Art

Cellular phones in recent years are required to be compliant with a plurality of frequencies with one terminal (to be a multiband-compliant terminal), and to be compliant with a plurality of wireless systems with one terminal (to be a multimode-compliant terminal). There is demand for a multimode- and multiband-compliant front-end circuit to process a plurality of transmission and reception signals at a high speed without deteriorating quality. Furthermore, a front-end circuit of a wireless communication terminal represented by a cellular phone or the like is required to be reduced in size.

Patent Document 1 discloses a power amplifier (hereinafter, referred to as PA in some cases) module used for a multiband- and multimode-compliant transmission circuit.

FIG. 10 is a circuit configuration diagram of a PA module disclosed in Patent Document 1. As illustrated in the diagram, a PA module 510 includes a plurality of amplification elements 511a and 511b, a variable filter circuit 512, and a matching circuit 513. The amplification elements 511a and 511b can amplify a transmission signal within a frequency range including a plurality of communication bands. The variable filter circuit 512 includes switch circuits 521a and 521b, and filter components 522a to 522c. A control IC included in the PA module 510 (not illustrated) selects a filter component, among the filter components 522a to 522c, whose pass band is a transmission band and whose attenuation band is a reception band of the selected communication bands to be used.

With the above-described configuration, a reception band noise, which may be generated when the PA module 510 amplifies a transmission signal, entering into a reception circuit can be effectively suppressed in the PA module 510.
Patent Document 1: International Publication No. 2015/002127

BRIEF SUMMARY OF THE DISCLOSURE

However, in a case where the PA module disclosed in Patent Document 1 is used for a front-end circuit, it is necessary to separately provide the switch circuits 521a and 521b for switching the selection of the filter components 522a to 522c. Therefore, in a case where all of the switch circuits 521a and 521b, the amplification elements 511a and 511b, and the filter components 522a to 522c are configured of chips which are different from one another, the size thereof increases.

Additionally, in a case where the amplification elements 511a and 511b are formed in the same chip in order to reduce the size, by oscillation or the like generated by increase in mutual interference of the amplified high-frequency signals, quality of the transmission signal deteriorates.

Accordingly, the present disclosure has been made in order to solve the above-described problem and an object of the disclosure is to provide a power amplification module, a front-end circuit, and a communication device which are reduced in size while maintaining quality of a high-frequency signal.

In order to accomplish the above-described object, a power amplification module according to one aspect of the present disclosure includes a previous stage amplification element to amplify a high-frequency signal, a posterior stage amplification element to amplify the high-frequency signal amplified by the previous stage amplification element, and a variable filter circuit arranged between the previous stage amplification element and the posterior stage amplification element to vary a pass band or an attenuation band in accordance with a frequency band of the high-frequency signal, in which the variable filter circuit includes one or more filter elements and a filter band selection portion to vary the pass band or the attenuation band of the variable filter circuit by being switched in accordance with the frequency band of the high-frequency signal, the previous stage amplification element and at least a part of the filter band selection portion are formed in one chip using a first chip, and the posterior stage amplification element is included in a second chip which is different from the first chip.

With this, by configuring the previous stage amplification element and the posterior stage amplification element using chips which are different from each other, mutual interference of the amplified high-frequency signals can be suppressed. Additionally, by forming the previous stage amplification element and at least the part of the filter band selection portion in one chip using the first chip, the size can be reduced. Accordingly, the size can be reduced while maintaining quality of the high-frequency signal.

Additionally, the one or more filter elements may be configured of a plurality of filter elements with the pass bands or the attenuation bands which are different from one another, the filter band selection portion may include a first switch element arranged between the previous stage amplification element and the plurality of filter elements to switch a connection between an output terminal of the previous stage amplification element and each of the plurality of filter elements, and a second switch element arranged between the posterior stage amplification element and the plurality of filter elements to switch a connection between an input terminal of the posterior stage amplification element and each of the plurality of filter elements, and at least one of the first switch element and the second switch element and the previous stage amplification element may be formed in one chip using the first chip.

With this configuration, by operation of the first switch element and the second switch element, a filter element corresponding to a communication band to be used is connected between the previous stage amplification element and the posterior stage amplification element. Additionally, since at least one of the first switch element and the second switch element and the previous stage amplification element are formed in one chip, the size can therefore be reduced while maintaining quality of the high-frequency signal.

Additionally, the one or more filter elements may be a resonator, the filter band selection portion may include a plurality of capacitive elements connected to the resonator and a plurality of switch elements respectively connected to the plurality of corresponding capacitive elements to switch a connection between at least one of the plurality of capacitive elements and the resonator, the previous stage amplification element, and the posterior stage amplification element, and at least one group of the plurality of capacitive elements and the plurality of switch elements and the previous stage amplification element may be formed in one chip using the first chip.

With this configuration, by operation of the above-described plurality of switch elements, a capacitive element corresponding to a communication band to be used among the above-described plurality of capacitive elements is connected to the resonator, the previous stage amplification element, and the posterior stage amplification element. With this, a resonant frequency and an anti-resonant frequency of the resonator vary corresponding to the communication band to be used. Additionally, since at least one group of the above-described plurality of capacitive elements and the above-described plurality of switch elements and the previous stage amplification element are formed in one chip, the size can be reduced while maintaining the quality of the high-frequency signal.

Additionally, the power amplification module may further include an amplification control portion to control amplification characteristics of the previous stage amplification element and the posterior stage amplification element in accordance with a frequency band of the high-frequency signal, in which the amplification control portion may be included in the first chip.

With this configuration, since the amplification control portion to control the amplification characteristics of each of the amplification elements in accordance with the communication band to be used is formed in one chip with the previous stage amplification element and at least the part of the filter band selection portion, the size can therefore be further reduced.

Additionally, a first wiring connecting the amplification control portion to the previous stage amplification element and a second wiring connecting the previous stage amplification element to the filter band selection portion may be formed in the first chip.

With this configuration, the first wiring and the second wiring are formed in the first chip, wiring lengths of the first wiring and the second wiring can therefore be shortened. Accordingly, a signal transmission loss and the size can be reduced. Furthermore, since wirings to the outside of the first chip and the second chip can be reduced to two wirings of a third wiring and a fourth wiring, the size can further be reduced.

Additionally, the previous stage amplification element, the filter band selection portion, and the posterior stage amplification element may be arranged on a mounting surface of a substrate, the one or more filter elements may be stacked and arranged so as to overlap with at least one of the previous stage amplification element, the filter band selection portion, and the posterior stage amplification element when the substrate is viewed in a plan view.

With this configuration, not only area reduction by forming the previous stage amplification element and at least a part of the filter band selection portion in one chip, but also area reduction of the power amplification module by stacking one or more filter elements with at least one of the previous stage amplification element, the filter band selection portion, and the posterior stage amplification element can be further achieved. Accordingly, the size can be further reduced while maintaining quality of the high-frequency signal.

Additionally, the one or more filter elements may be stacked and arranged so as to overlap with only at least one of the previous stage amplification element and the filter band selection portion among the previous stage amplification element, the filter band selection portion, and the posterior stage amplification element in the plan view.

Since a power level of the high-frequency signal to be amplified is large in the posterior stage amplification element, if the one or more filter elements are arranged in the vicinity of the posterior stage amplification element, filter characteristics of the filter elements deteriorate by interference with the high-frequency signal. In contrast, since the one or more filter elements are stacked and arranged so as not to overlap with the posterior stage amplification element in the plan view, the size can be reduced without deteriorating the characteristics of the filter element.

Additionally, the one or more filter elements may be stacked and arranged so as to overlap with only the filter band selection portion among the previous stage amplification element, the filter band selection portion, and the posterior stage amplification element in the plan view.

A power level in the previous stage amplification element is not as large as that in the posterior stage amplification element, but is larger than those of other high-frequency signals. Accordingly, it is further preferable that the one or more filter elements be not arranged in the vicinity of the previous stage amplification element as well as the posterior stage amplification element. According to the above-described configuration, since the one or more filter elements are stacked and arranged so as not to overlap with the posterior stage amplification element or the previous stage amplification element in the plan view, the size can therefore be reduced without deteriorating the characteristics of the filter element. Furthermore, the one or more filter elements are arranged so as to be closest to the filter band selection portion, a wiring length of the variable filter circuit can therefore be shortened.

Additionally, the previous stage amplification element may amplify a high-frequency signal in a frequency range including a plurality of communication bands, the posterior stage amplification element may be configured of a plurality of amplification elements respectively corresponding to the plurality of communication bands, and in the posterior stage amplification element, a selected amplification element, among the plurality of amplification elements, corresponding to a communication band to be used among the plurality of communication bands may amplify the high-frequency signal amplified by the previous stage amplification element.

According to the above-described configuration, configuring the high-frequency signal in the frequency range including the plurality of communication bands with one previous stage amplification element can contribute to reduction in the size of the power amplification module, and arranging a plurality of amplification elements corresponding to the pass bands as the posterior stage amplification element makes it possible to maintain the high quality of a high-frequency transmission signal outputted from the power amplification module.

Additionally, the first chip may be configured of a CMOS, and the second chip may be configured of GaAs.

With this configuration, configuring the amplification control portion and the previous stage amplification element, to which power handling is not required, of the CMOS makes it possible to manufacture the power amplification module at a low cost. On the other hand, configuring the posterior stage amplification element, in which a power level of the high-frequency transmission signal is high, of a GaAs-based material makes it possible to output a high-frequency transmission signal having high quality amplification characteristics and noise characteristics.

Additionally, one aspect of the present disclosure may be a front-end circuit including the power amplification module including the characteristic configurations as described above, a reception amplification circuit, and a wave separator to output a reception signal from an antenna element to the reception amplification circuit and to output the high-frequency signal amplified by the power amplification module to the antenna element as a transmission signal.

Additionally, in the variable filter circuit, the pass band may be a transmission band corresponding to a communication band to be used which is selected from the plurality of communication bands, the attenuation band may be a reception band corresponding to the communication band to be used.

According to the above-described configuration, the front-end circuit reduced in size can be provided while maintaining quality of the high-frequency transmission signal and the high-frequency reception signal.

Additionally, one aspect of the present disclosure may be a communication device including the front-end circuit including the characteristic configurations as described above, an RF signal processing circuit to output a high-frequency transmission signal to the front-end circuit and to which the high-frequency reception signal is inputted from the front-end circuit, and a baseband signal processing circuit to perform signal processing by converting the high-frequency reception signal received from the RF signal processing circuit to an intermediate frequency signal and to convert an intermediate frequency signal to a high-frequency signal and output the converted signal to the RF signal processing circuit.

According to the above-described configuration, the communication device reduced in size can be provided while maintaining quality of the high-frequency transmission signal and the high-frequency reception signal.

A power amplification module according to the present disclosure can be reduced in size while maintaining quality of a high-frequency signal by forming a previous stage amplification element and a filter band selection portion in one chip which is different from a chip in which a posterior stage amplification element is formed.

DETAILED DESCRIPTION OF THE DISCLOSURE

Figure 1:
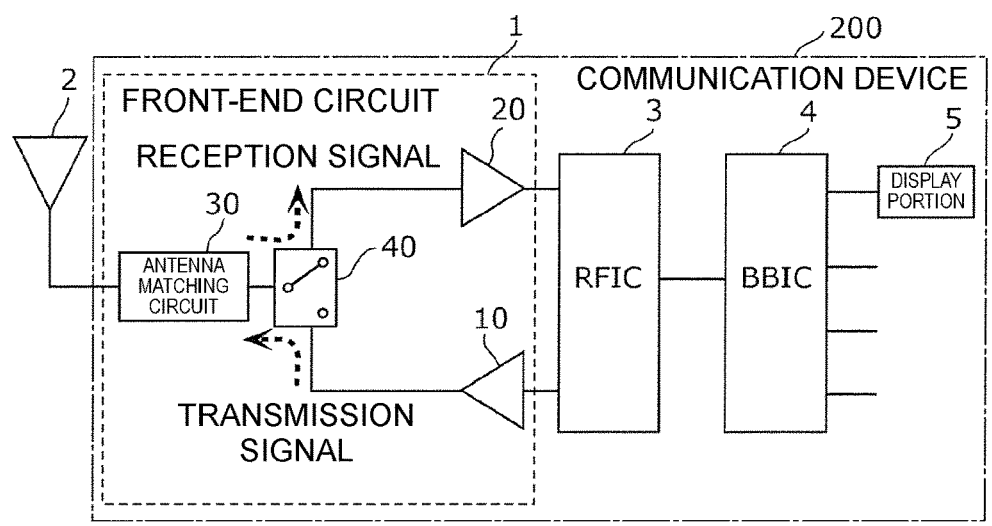
FIG. 1 is a functional block configuration diagram of a communication device according to a first embodiment.

Hereinafter, embodiments of the present disclosure will be described in detail using embodiments and drawings thereof. Note that, all embodiments described below indicate comprehensive or specific examples. Numerical values, shapes, materials, constituent elements, arrangement and connection forms of the constituent elements, and the like, which will be described in the following embodiments, are examples and are not intended to limit the present disclosure. Constituent elements which are not described in independent claims among the constituent elements in the following embodiments are described as arbitrary constituent elements. Additionally, sizes or size ratios of the constituent elements illustrated in the drawings are not necessarily strict.

First Embodiment

[1.1 Communication Device Configuration]

FIG. 1 is a functional block configuration diagram of a communication device 200 according to a first embodiment. This diagram illustrates the communication device 200 and an antenna element 2. The communication device 200 includes a front-end circuit 1, an RF signal processing circuit 3, a baseband signal processing circuit 4, and a display portion 5. The front-end circuit 1 is, for example, arranged in a front-end portion of a multimode/multiband-compliant cellular phone.

The front-end circuit 1 includes a PA (Power Amplifier) module 10, a low noise amplifier circuit 20, an antenna matching circuit 30, and an antenna switch 40.

The antenna matching circuit 30, which is connected to the antenna element 2 and the antenna switch 40, is a circuit for matching the antenna element 2 and the front-end circuit 1 with each other. With this, the front-end circuit 1 can receive a reception signal from the antenna element 2 with low loss, and output a transmission signal to the antenna element 2 with low loss. The antenna matching circuit 30 is configured of one or more high frequency circuit components, for example, formed of an inductor formed in a chip shape or in a pattern and a capacitor formed in a chip shape or in a pattern. Note that, the antenna matching circuit 30 is not a required constituent element of the front-end circuit 1. Additionally, the antenna matching circuit 30 may be a multiband- and multimode-compliant variable matching circuit which varies impedance in accordance with a selected band or mode.

The antenna switch 40 is a wave separator, by connecting the antenna element 2 (and the antenna matching circuit 30) to one of a transmission side signal path and a reception side signal path, for switching a connection between the antenna element 2 and each of the plurality of signal paths. To be more specific, the antenna switch 40 includes an input terminal connected to the antenna matching circuit 30 and an output terminal connected to the transmission side signal path or the reception side signal path.

Note that, although FIG. 1 illustrates the antenna switch 40 as a single-pole double-throw type high-frequency switch, in a case where a plurality of the transmission side signal paths and a plurality of the reception side signal paths are arranged, the antenna switch 40 is not limited to one-input two-output type. Additionally, instead of the antenna switch 40, a multiplexer including a duplexer and a triplexer which separate transmission waves and reception waves may be arranged.

The PA module 10 is a power amplification module which amplifies a high-frequency transmission signal outputted from the RF signal processing circuit 3 and outputs the resulting signal toward the antenna switch 40. The PA module 10 is a primary element of the present disclosure and will be described later in detail.

The low noise amplifier circuit 20 is a high-frequency amplification circuit which amplifies a high-frequency reception signal outputted from the antenna switch 40 and outputs the resulting signal to the RF signal processing circuit 3.

The RF signal processing circuit 3 performs signal processing on the high-frequency reception signal inputted from the antenna element 2 through the reception side signal path by down conversion or the like, and outputs a reception signal generated by the signal processing to the baseband signal processing circuit 4. The RF signal processing circuit 3 is an RFIC (Radio Frequency Integrated Circuit), for example. Additionally, the RF signal processing circuit 3 performs signal processing on a transmission signal inputted from the baseband signal processing circuit 4 by up conversion or the like, and outputs a high-frequency transmission signal generated by the signal processing to the PA module 10.

The baseband signal processing circuit 4 is a circuit which performs signal processing using an intermediate frequency band with a lower frequency than that of the high-frequency signal in the front-end portion. An image signal processed by the baseband signal processing circuit 4 is used for image display in the display portion 5, for example, an audio signal processed by the baseband signal processing circuit 4 is used for a call through a speaker, for example.

Note that, the front-end circuit 1 may include a transmission side filter circuit capable of varying bandpass characteristics in accordance with a selected frequency band in the transmission side signal path between the antenna switch 40 and the PA module 10. Additionally, the front-end circuit 1 may include a reception side filter circuit capable of varying bandpass characteristics in accordance with a selected frequency band in the reception side signal path between the antenna switch 40 and the low noise amplifier circuit 20.

[1.2 PA Module Configuration]

Figure 2:
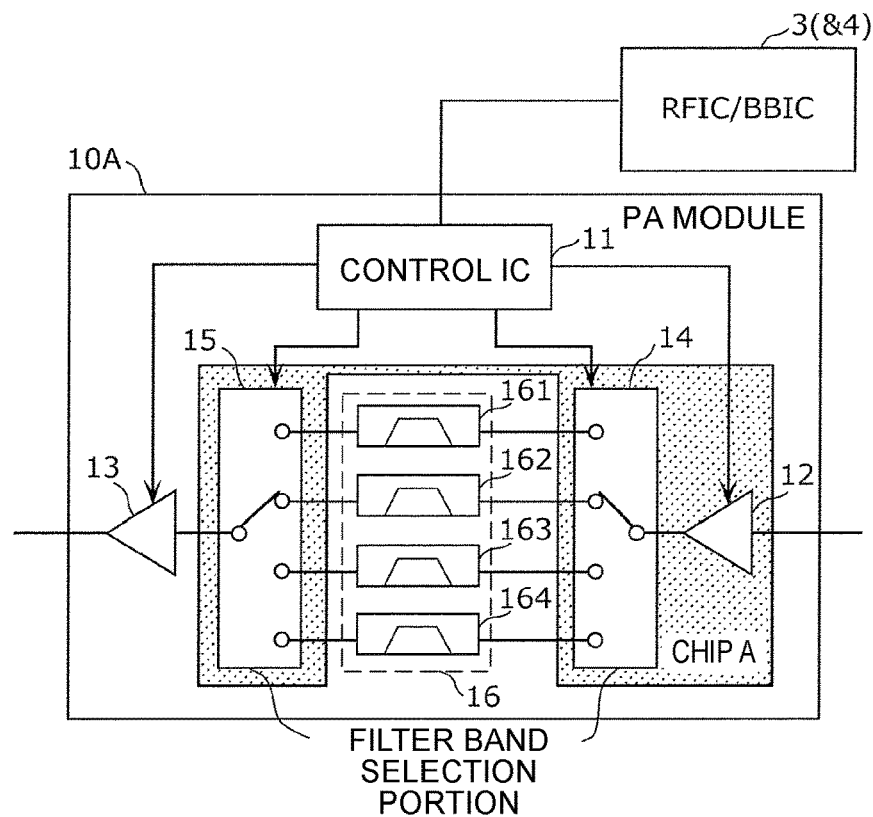
FIG. 2 is a circuit configuration diagram of a PA module according to the first embodiment.

FIG. 2 is a circuit configuration diagram of a PA module 10A according to the first embodiment. The PA module 10A is applied to the PA module 10 of the front-end circuit 1 illustrated in FIG. 1. The PA module 10A includes a control IC 11, a previous stage amplification element 12, a posterior stage amplification element 13, switches 14 and 15, and a filter portion 16.

The previous stage amplification element 12 and the posterior stage amplification element 13 are multimode/multiband-compliant power amplifiers which can be used in a plurality of communication schemes and a plurality of communication bands. An input terminal of the previous stage amplification element 12 is an input terminal of the PA module 10A, and an output terminal of the previous stage amplification element 12 is connected to a common terminal of the switch 14. An input terminal of the posterior stage amplification element 13 is connected to a common terminal of the switch 15, and an output terminal of the posterior stage amplification element 13 is an output terminal of the PA module 10A.

The filter portion 16 includes filter elements 161, 162, 163, and 164 whose pass bands and attenuation bands are different from one another. The filter elements 161 to 164 are typical band pass filters, but may be a low pass filter, a high pass filter, or a band elimination filter depending on a frequency arrangement relationship of a plurality of pass bands. Note that, examples of the filter elements 161 to 164 include a surface acoustic wave filter, a boundary acoustic wave filter, an elastic wave filter using a BAW (Bulk Acoustic Wave), an LC filter configured of an inductance element and a capacitor element, and the like. Additionally, the number of the filter elements configuring the filter portion 16 is not limited to four pieces, is determined in accordance with the number of bands or the number of modes which will be used. Additionally, at least one or more of the filter elements 161 to 164 may be a through-path. Note that, the through-path refers to a distributed constant-type transmission line.

The switch 14 is arranged between the previous stage amplification element 12 and the filter portion 16, and is a first switch element for switching a connection between the output terminal of the previous stage amplification element 12 and the filter portion 16. The switch 14 includes one common terminal and four selection terminals, the one common terminal is connected to the output terminal of the previous stage amplification element 12, and the four selection terminals are respectively connected to one side terminals of the filter elements 161 to 164.

The switch 15 is arranged between the posterior stage amplification element 13 and the filter portion 16, and is a second switch element for switching a connection between the input terminal of the posterior stage amplification element 13 and the filter portion 16. The switch 15 includes one common terminal and four selection terminals, the one common terminal is connected to the input terminal of the posterior stage amplification element 13, and the four selection terminals are respectively connected to the other side terminals of the filter elements 161 to 164. In the switches 14 and 15, by a control signal supplied from any one of the control IC 11, the RF signal processing circuit 3, and the baseband signal processing circuit 4, which will be described later, the one common terminal and any one of the four selection terminals are connected to each other.

The switches 14 and 15 and the filter portion 16 are arranged in a signal path from the output terminal of the previous stage amplification element 12 to the input terminal of the posterior stage amplification element 13, and configure a variable filter circuit which varies a pass band and an attenuation band in accordance with a frequency band of a high-frequency signal.

The switches 14 and 15 configure a filter band selection portion which varies the pass band and the attenuation band of the variable filter circuit by being switched in accordance with the frequency band of the high-frequency signal.

The control IC 11 is an amplification control portion which controls amplification characteristics of the previous stage amplification element 12 and the posterior stage amplification element 13 in accordance with a communication band to be used (the frequency band of the high-frequency signal). Note that, the amplification characteristics of the previous stage amplification element 12 and the posterior stage amplification element 13 are, for example, gains (amplification factor) of the previous stage amplification element 12 and the posterior stage amplification element 13. Additionally, the control IC 11 controls the switches 14 and 15 on the basis of a control signal indicating a communication band to be selected and used (the frequency band of the high-frequency signal) supplied from the RF signal processing circuit 3 or the baseband signal processing circuit 4. To be more specific, in a case where the above-described control signal indicates that a band A is selected, for example, the control IC 11 controls the switches 14 and 15 such that the filter element 161 whose pass band is a transmission band of the band A and whose attenuation band is a reception band of the band A is connected to the previous stage amplification element 12 and the posterior stage amplification element 13.

According to the above-described configuration, the high-frequency transmission signal inputted into the PA module 10A from the RF signal processing circuit 3 is amplified by the previous stage amplification element 12. The amplified high-frequency transmission signal is inputted into the variable filter circuit. The high-frequency transmission signal inputted into the variable filter circuit passes through a filter element corresponding to a communication scheme and a communication band. The high-frequency transmission signal which has passed through the variable filter circuit is further amplified by the posterior stage amplification element 13 and outputted from the PA module 10A.

Although, when the high-frequency transmission signal having the selected frequency band is amplified by the PA module, a reception band component of the frequency band is also amplified by the previous stage amplification element 12, the amplified reception band component attenuates by passing through the filter element selected on the basis of the selected frequency band. Accordingly, it is possible to previously and effectively suppress, in the PA module 10A, the amplified reception band component from entering into the low noise amplifier circuit 20 or the like and being a reception band noise.

Additionally, according to the above-described configuration, a circuit can be obtained in which characteristics of a filter, an antenna switch, or the like which is arranged subsequent to the RF signal processing circuit 3 and the PA module 10 can be eased and in which increase in an area is minimized.

Here, as the existing PA module 510 disclosed in Patent Document 1, in a case where all of the switch circuits 521a and 521b, the amplification elements 511a and 511b, and the filter components 522a to 522c are configured of chips which are different with one another, there is a limit to reduce the size thereof, and thus this configuration cannot contribute to reduction in size of the front-end portion. Additionally, in a case where the amplification elements 511a and 511b are formed in the same chip in order to further reduce the size, by oscillation or the like generated by increase in mutual interference of the high-frequency signals, quality of the transmission signal deteriorates.

In contrast, in the PA module 10A according to the present embodiment, the previous stage amplification element 12 and the switches 14 and 15 are formed in one chip using a chip A (first chip). Furthermore, the posterior stage amplification element 13 is included in a chip which is different from the chip A.

According to the above-described configuration, by configuring the previous stage amplification element 12 and the posterior stage amplification element 13 using chips which are different from each other, mutual interference of the high-frequency signals can be suppressed. Additionally, by forming the previous stage amplification element 12 and the switches 14 and 15 in one chip using the chip A, in comparison with a case where the previous stage amplification element 12 and the switches 14 and 15 are configured using chips which are different from each other, the size can be reduced. Accordingly, the size thereof can be reduced while maintaining quality of the high-frequency signal.

[1.3 PA Module Configuration According to First Variation]

Figure 3:
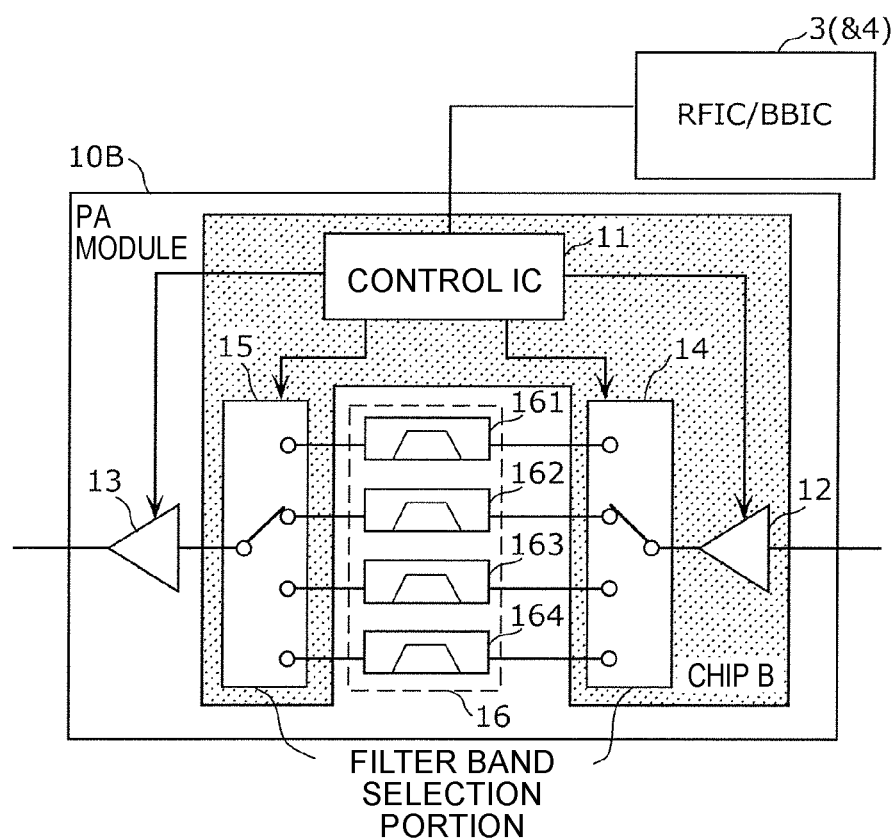
FIG. 3 is a circuit configuration diagram of a PA module according to a first variation on the first embodiment.

FIG. 3 is a circuit configuration diagram of a PA module 10B according to a first variation on the first embodiment. The PA module 10B according to the present variation includes the same constituent elements as those of the PA module 10A according to the first embodiment, but is different from the PA module 10A in a range of the constituent elements to be formed in one chip. Hereinafter, descriptions of each of the constituent elements configuring the PA module 10B will be omitted, and primarily the points that are different from the PA module 10A will be described.

In the PA module 10B according to the present variation, the previous stage amplification element 12, the switches 14 and 15, and the control IC 11 are formed in one chip using a chip B (first chip). Furthermore, the posterior stage amplification element 13 is included in a chip which is different from the chip B.

With this configuration, since the control IC 11 is formed in one chip with the previous stage amplification element 12 and the switches 14 and 15, the size can be further reduced than the PA module 10A according to the first embodiment. Additionally, a power level of the control signal processed by the control IC 11 is much lower than power levels of the high-frequency signals processed by the previous stage amplification element 12 and the posterior stage amplification element 13. Accordingly, even if the control IC 11 is formed in one chip with the previous stage amplification element 12 and the switches 14 and 15, quality of the high-frequency signals of the previous stage amplification element 12 and the posterior stage amplification element 13 can be secured.

Figure 4A:
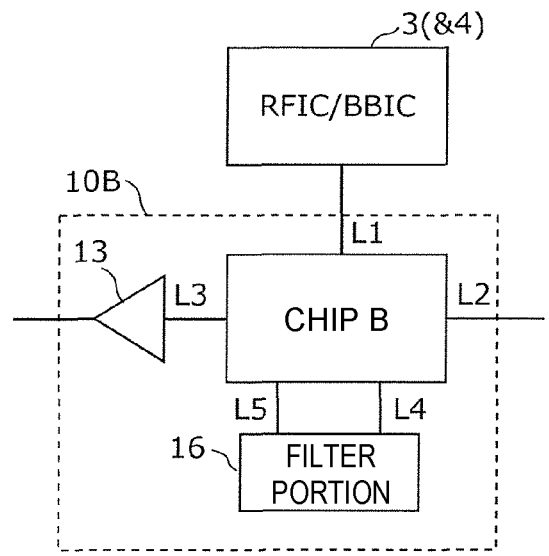
FIG. 4A is a wiring configuration diagram of the PA module according to the first variation on the first embodiment.

FIG. 4A is a wiring configuration diagram of the PA module 10B according to the first variation on the first embodiment. This diagram illustrates a wiring configuration for connecting to the chip B which includes the previous stage amplification element 12, the switches 14 and 15, and the control IC 11. The chip B and the RF signal processing circuit 3 (baseband signal processing circuit 4) are connected by wirings L1 and L2, the chip B and the posterior stage amplification element 13 are connected by a wiring L3

(third wiring), the chip B and the filter portion 16 are connected by wirings L4 and L5 (fourth wiring). In other words, five out-of-chip wirings are arranged, and the out-of-chip wirings in the PA module 10B are two wirings of the above-described third wiring and fourth wiring. Additionally, a first wiring connecting the control IC 11 to the previous stage amplification element 12 and a second wiring connecting the previous stage amplification element 12 to the switch 14 are formed in the chip B, wiring lengths of the first wiring and the second wiring can therefore be shortened.

Figure 4B:
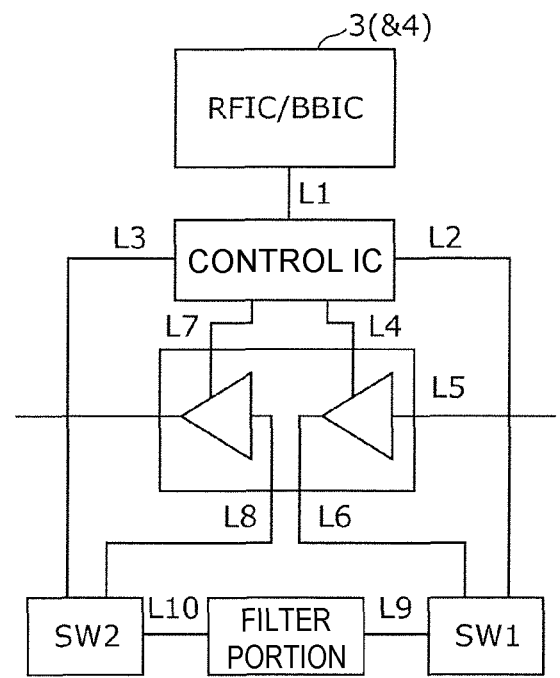
FIG. 4B is a wiring configuration diagram of a PA module according to a comparative example.

FIG. 4B is a wiring configuration diagram of a PA module according to a comparative example. In the PA module according to the comparative example illustrated in FIG. 4B, there are no constituent elements which are formed in one chip excluding a previous stage amplification element and a posterior stage amplification element. In this configuration, a control IC and an RF signal processing circuit (baseband signal processing circuit) are connected by a wiring L1, the control IC and a switch SW1 are connected by the wiring L2, the control IC and a switch SW2 are connected by the wiring L3, the control IC and the previous stage amplification element are connected by the wiring L4, the previous stage amplification element and the RF signal processing circuit (baseband signal processing circuit) are connected by the wiring L5, the previous stage amplification element and the switch SW1 are connected by a wiring L6, the control IC and the posterior stage amplification element are connected by a wiring L7, the posterior stage amplification element and the switch SW2 are connected by a wiring L8, a filter portion and the switch SW1 are connected by a wiring L9, the filter portion and the switch SW2 are connected by a wiring L10. In other words, ten out-of-chip wirings are arranged, and the out-of-chip wirings in the PA module according to the comparative example is seven wirings of the wirings L2, L3, L4, L6, L7, L8, and L9 (and L10).

According to a wiring layout of the PA module 10B according to the present first variation, since the first wiring and the second wiring are formed in the first chip, the wiring lengths of the first wiring and the second wiring can therefore be shortened. Accordingly, a signal transmission loss can be reduced and the size can be reduced. Furthermore, since the out-of-chip wirings can be reduced to two wirings of the third wiring and the fourth wiring in contrast to the PA module according to the comparative example including the seven out-of-chip wirings, the size can therefore be further reduced.

[1.4 PA Module Configuration According to Second Variation]

Figure 5A:
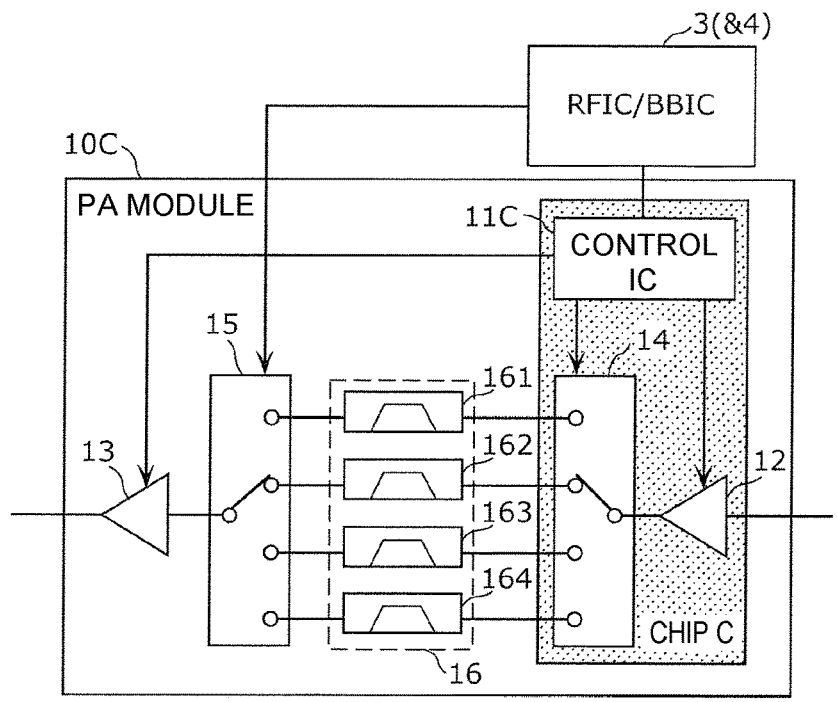
FIG. 5A is a circuit configuration diagram of the PA module according to a second variation on the first embodiment.

FIG. 5A is a circuit configuration diagram of a PA module 10C according to a second variation on the first embodiment. The PA module 10C according to the present variation includes the same constituent elements as those of the PA module 10A according to the first embodiment, but is different from the PA module 10A in a range of the constituent elements to be formed in one chip and a control object of the control IC. Hereinafter, descriptions of each of the constituent elements configuring the PA module 10C will be omitted, and primarily the points that are different from the PA module 10A will be described.

In the PA module 10C according to the present variation, the previous stage amplification element 12, the switch 14, and a control IC 11C are formed in one chip using a chip C (first chip). In other words, the switch 14, which is at least a part of the filter band selection portion, and the previous stage amplification element 12 are formed in one chip using the chip C. Furthermore, the posterior stage amplification element 13 is included in a chip which is different from the chip C.

With this configuration, since the control IC 11C is formed in one chip with the previous stage amplification element 12 and the switch 14, the size can be reduced.

Additionally, since the switch 15 is not included in the chip C, the control IC 11C included in the chip C does not control the switch 15, the RF signal processing circuit 3 (or the baseband signal processing circuit 4) controls the switch 15. With this configuration, an out-of-chip wiring from the chip C can be reduced.

[1.5 PA Module Configuration According to Third Variation]

Figure 5B:
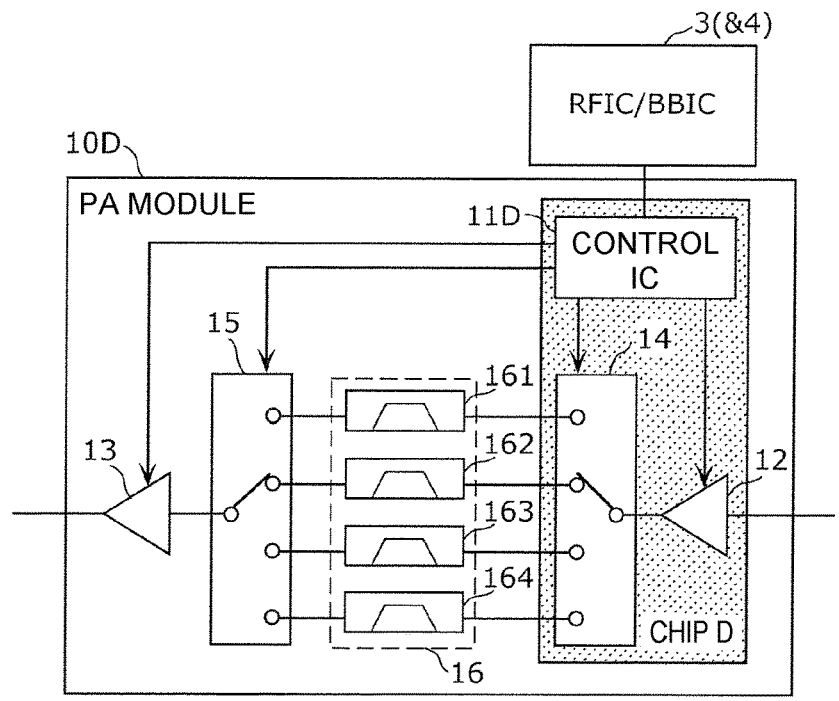
FIG. 5B is a circuit configuration diagram of the PA module according to a third variation on the first embodiment.

FIG. 5B is a circuit configuration diagram of a PA module 10D according to a third variation on the first embodiment. The PA module 10D according to the present variation is different from the PA module 10C according to the second variation only in a control object of the control IC. Hereinafter, descriptions of each of the constituent elements configuring the PA module 10D will be omitted, and the points that are different from the PA module 10C will primarily be described.

In the PA module 10D according to the present variation, a control IC 11D included in a chip D controls not only the previous stage amplification element 12, the posterior stage amplification element 13, and the switch 14 but also the switch 15. With this configuration, the switches 14 and 15 are controlled by the same control IC 11D, timing control, such as a communication band switch can therefore be performed with ease.

[1.6 PA Module Configuration According to Fourth Variation]

Figure 6A:
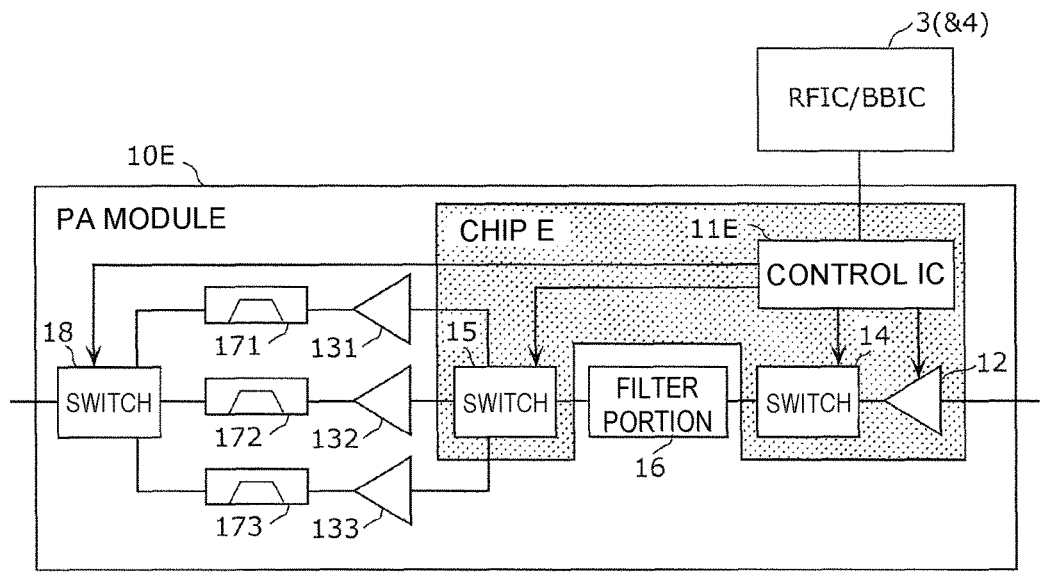
FIG. 6A is a circuit configuration diagram of the PA module according to a fourth variation on the first embodiment.

FIG. 6A is a circuit configuration diagram of a PA module 10E according to a fourth variation on the first embodiment. The PA module 10E according to the present variation is different from the PA module 10B according to the first variation in a configuration of the posterior stage amplification element. Hereinafter, descriptions of the same points as the PA module 10B will be omitted, and the points that are different from the PA module 10B will primarily be described.

In the PA module 10E according to the present variation, the previous stage amplification element 12, the switches 14 and 15, and a control IC 11E are formed in one chip using a chip E (first chip). In other words, the switches 14 and 15, which are the filter band selection portion, and the previous stage amplification element 12 are formed in one chip using the chip E. Furthermore, amplification elements 131 to 133 configuring the posterior stage amplification element are included in a chip which is different from a chip E.

When amplifying the high-frequency transmission signal by the PA module with high quality, it is effective to provide difference in the amplification characteristics in the previous stage amplification element and the posterior stage amplification element which are in a cascading connection. In other words, in the previous stage amplification element, from the standpoint that the power level of the high-frequency transmission signal to be inputted is not so high, the high-frequency transmission signal is desired to be amplified across a wide band. On the other hand, from the standpoint that the posterior stage amplification element is arranged in the final stage of the PA module and the power level of the high-frequency transmission signal is high, the high-frequency transmission signal amplified by the previous stage amplification element is desired to be amplified with high quality.

Here, a high frequency amplification element generally has a trade-off relationship between the frequency characteristics and gain and noise characteristics. In other words, the selection of whether to give priority to the wide band amplification rather than the gain and noise characteristics or to give priority to the gain and noise characteristics even with a narrowband may be required.

Accordingly, in the present variation, one amplification element capable of amplifying the high-frequency signal across the wide band rather than the gain characteristics and noise characteristics is arranged in the previous stage amplification element. On the other hand, in the posterior stage amplification element, since high gain characteristics and low noise characteristics are required rather than the wide band characteristics, a plurality of amplification elements having high gain characteristics and low noise characteristics in each of the frequency bands are arranged in parallel.

As illustrated in FIG. 6A, the PA module 10E includes the amplification elements 131, 132, and 133 connected in parallel to the switch 15 as the posterior stage amplification element. The PA module 10E further includes a switch 18 to switch the selection of the amplification elements 131 to 133 in accordance with the frequency band to be selected, and a transmission side filter element 171 connected to the amplification element 131, a transmission side filter element 172 connected to the amplification element 132, and a transmission side filter element 173 connected to the amplification element 133, which are arranged between the switches 15 and 18.

According to the above-described configuration, configuring the previous stage amplification element with one amplification element can contribute to reduction in size of the PA module 10E, and arranging a plurality of posterior stage amplification elements corresponding to the pass bands makes it possible to maintain high quality of the high-frequency transmission signal outputted from the PA module 10E.

Additionally, in the PA module 10E according to the present variation, the control IC 11E included in the chip E controls not only the previous stage amplification element 12 and the switches 14 and 15 but also the switch 18. With this configuration, since the switches 14, 15, and 18 are controlled by the same control IC 11E, the timing of a communication band switch or the like can therefore be controlled with ease.

[1.7 PA Module Configuration According to Fifth Variation]

Figure 6B:
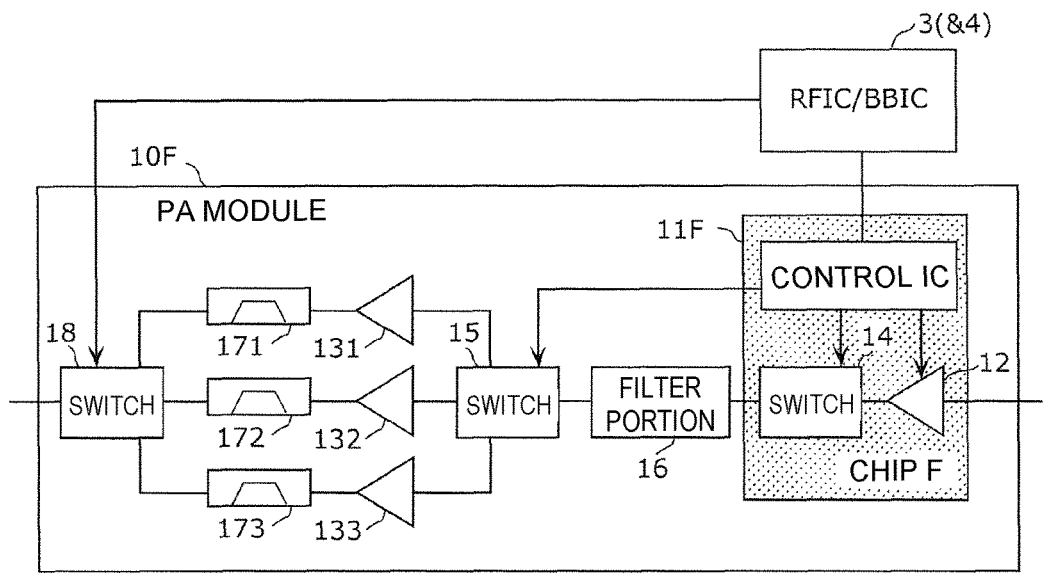
FIG. 6B is a circuit configuration diagram of the PA module according to a fifth variation on the first embodiment.

FIG. 6B is a circuit configuration diagram of a PA module 10F according to a fifth variation on the first embodiment. The PA module 10F according to the present variation includes the same constituent elements as those of the PA module 10E according to the fourth variation, but is different from the PA module 10E in a range of the constituent elements to be formed in one chip and a control object of the control IC. Hereinafter, descriptions of each of the constituent elements configuring the PA module 10F will be omitted, and the points that are different from the PA module 10E will primarily be described.

In the PA module 10F according to the present variation, the previous stage amplification element 12, the switch 14, and a control IC 11F are formed in one chip using a chip F (first chip). In other words, the switch 14, which is at least a part of the filter band selection portion, and the previous stage amplification element 12 are formed in one chip using the chip F. Furthermore, the amplification elements 131 to 133 are included in a chip which is different from the chip F.

With this configuration, since the control IC 11F is formed in one chip with the previous stage amplification element 12 and the switch 14, the size can be reduced.

Additionally, configuring the previous stage amplification element with one amplification element can contribute to reduction in size of the PA module 10F, and arranging a plurality of posterior stage amplification elements corresponding to the pass bands makes it possible to maintain high quality of the high-frequency transmission signal outputted from the PA module 10F.

Additionally, the control IC 11F included in the chip F does not control the switch 18, the RF signal processing circuit 3 (or the baseband signal processing circuit 4) controls the switch 18. With this configuration, an out-of-chip wiring from the chip F can be reduced.

[1.8 Other Variations or the Like]

Note that, in the first embodiment and the first to fifth variations thereon, the first chips (the chips A to F) are preferably configured of a CMOS (Complementary Metal Oxide Semiconductor), and the second chips are preferably configured of GaAs.

In other words, configuring the control ICs 11 (11A to 11F) and the previous stage amplification element 12, to which power handling is not required, of the CMOS makes it possible to manufacture the PA module at a low cost. On the other hand, configuring the posterior stage amplification element 13 (and the amplification elements 131 to 133), in which a power level of the high-frequency transmission signal is high, of a GaAs based material makes it possible to output a high-frequency transmission signal having high quality amplification characteristics and noise characteristics.

Second Embodiment

A power amplification module 10G according to the present embodiment is different from the power amplification module 10A according to the first embodiment in the configuration of the variable filter circuit arranged between the previous stage amplification element 12 and the posterior stage amplification element 13. Hereinafter, descriptions of common points to the PA module 10A according to the first embodiment will be omitted, and the points that are different from the PA module 10A will primarily be described.

[2.1 PA Module Configuration]

Figure 7:
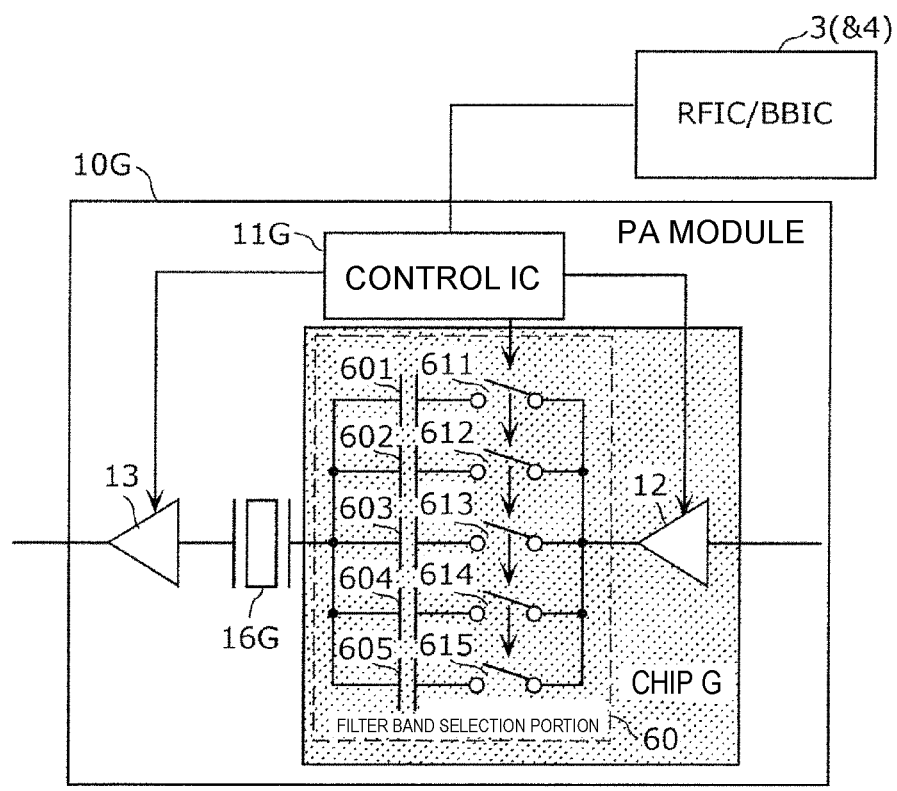
FIG. 7 is a circuit configuration diagram of a PA module according to a second embodiment.

FIG. 7 is a circuit configuration diagram of the PA module 10G according to a second embodiment. The PA module 10G is applied to the PA module 10 of the front-end circuit 1 illustrated in FIG. 1. The PA module 10G includes a control IC 11G, the previous stage amplification element 12, the posterior stage amplification element 13, a resonator 16G, and a filter band selection portion 60.

The previous stage amplification element 12 and the posterior stage amplification element 13 are multimode/multiband-compliant power amplifiers which can be used in a plurality of communication schemes and a plurality of communication bands. The input terminal of the previous stage amplification element 12 is an input terminal of the PA module 10G, and the output terminal of the previous stage amplification element 12 is connected to an input terminal of the filter band selection portion 60. The input terminal of the posterior stage amplification element 13 is connected to an output terminal of the resonator 16G, and the output terminal of the posterior stage amplification element 13 is the output terminal of the PA module 10G.

The resonator 16G is a capacitive surface acoustic wave resonator configured of a piezoelectric substrate and a comb-shaped electrode formed on the piezoelectric substrate, for example, and is a filter element having a resonance point and an anti-resonance point determined by physical properties of the piezoelectric substrate, a shape of the comb-shaped electrode, and the like. Note that, the resonator 16G may not necessarily be the surface acoustic wave resonator, may be a boundary acoustic wave resonator, an elastic wave resonator using a BAW (Bulk Acoustic Wave), an LC resonator configured of an inductance element and a capacitor element, and the like.

The filter band selection portion 60 includes the input terminal and an output terminal, the output terminal is connected to an input terminal of the resonator 16G. The filter band selection portion 60 includes capacitive elements 601, 602, 603, 604, and 605 which are connected in parallel to the resonator 16G, and switch elements 611, 612, 613, 614, and 615 which are respectively connected to the corresponding capacitive elements 601 to 605 and switch a connection between at least one of the capacitive elements 601 to 605 and the resonator 16G, the previous stage amplification element 12, and the posterior stage amplification element 13. The filter band selection portion 60 varies a pass band and an attenuation band of the variable filter circuit by the switch elements 611 to 615 being switched by a control signal supplied from the control IC 11G.

Note that, the plurality of capacitive elements connected to the resonator 16G may not be configured so as to be connected to the resonator 16G in parallel, for example, the plurality of capacitive elements may be configured so as to be connected to resonator 16G in series. In this case, for example, by providing switch elements, which are corresponding to each of the capacitive elements, parallel to each of the capacitive elements, and by selecting an electric path passing through the capacitive elements or an electric path passing through the switch elements without passing through the capacitive elements, combined capacitance added to the resonator 16G can be varied.

The resonator 16G and the capacitive elements 601 to 605 and the switch elements 611 to 615 are arranged in a signal path from the output terminal of the previous stage amplification element 12 to the input terminal of the posterior stage amplification element 13, and configure a variable filter circuit which varies a pass band and an attenuation band in accordance with a frequency band of a high-frequency signal.

Additionally, the capacitive elements 601 to 605 and the switch elements 611 to 615 configure the filter band selection portion 60 which selectively switches the resonance point (for example, the pass band) and the anti-resonance point (for example, the attenuation band) of the resonator 16G in accordance with the frequency band of the high-frequency signal.

Note that, the variable filter circuit according to the present embodiment is not limited to the above-described configuration, may be configured such that the resonator 16G is connected to the previous stage amplification element 12, and the filter band selection portion 60 is connected to the posterior stage amplification element 13. The capacitive elements 601 to 605 may be arranged on the previous stage amplification element 12 side, the switch elements 611 to 615 may be arranged on the posterior stage amplification element 13 side.

The control IC 11G is an amplification control portion which controls amplification characteristics of the previous stage amplification element 12 and the posterior stage amplification element 13 in accordance with a communication band to be selected and used (the frequency band of the high-frequency signal). The control IC 11G controls the switch elements 611 to 615 on the basis of a control signal indicating the communication band to be selected and used (the frequency band of the high-frequency signal) supplied from the RF signal processing circuit 3 or the baseband signal processing circuit 4. To be more specific, in a case where the above-described control signal indicates that a band B is selected, for example, the control IC 11G controls the switch elements 611 to 615 such that the resonator 16G and at least any one of the capacitive elements 601 to 605 configure filter characteristics whose pass band is the transmission band of the band B and whose attenuation band is the reception band of the band B.

According to the above-described configuration, the high-frequency transmission signal inputted into the PA module 10G from the RF signal processing circuit 3 or the baseband signal processing circuit 4 is amplified by the previous stage amplification element 12. The amplified high-frequency transmission signal is inputted into the variable filter circuit. The high-frequency transmission signal inputted into the variable filter circuit passes through at least one of the capacitive elements 601 to 605 corresponding to the communication scheme and the communication band and the resonator 16G. The high-frequency transmission signal which has passed through the variable filter circuit is further amplified by the posterior stage amplification element 13 and outputted from the PA module 10G.

When the high-frequency transmission signal having the selected frequency band is amplified by the PA module, although, a reception band component of the frequency band is also amplified by the previous stage amplification element 12, the amplified reception band component attenuates by passing through a capacitive element selected on the basis of the selected frequency band and a resonator. Accordingly, it is possible to previously and effectively suppress, in the PA module 10G, the amplified reception band component from entering into the low noise amplifier circuit 20 or the like and becoming a reception band noise.

Here, in the PA module 10G according to the present embodiment, the previous stage amplification element 12 and the filter band selection portion 60 are formed in one chip using a chip G (first chip). Furthermore, the posterior stage amplification element 13 is included in a chip which is different from the chip G.

With this, by configuring the previous stage amplification element 12 and the posterior stage amplification element 13 using chips which are different from each other, mutual interference of the high-frequency signals can be suppressed. Additionally, by forming the previous stage amplification element 12 and the filter band selection portion 60 in one chip using the chip G, in comparison with a case where the previous stage amplification element 12 and the variable filter circuit are configured using chips which are different from each other, the size can be reduced. Accordingly, the size thereof can be reduced while maintaining quality of the high-frequency signal.

Note that, in the present embodiment, although the previous stage amplification element 12 and all of the filter band selection portion 60 are formed in one chip using the chip G, the configuration is not limited thereto. For example, the switch elements 611 to 615 or the capacitive elements 601 to 605 of the filter band selection portion 60 and the previous stage amplification element 12 may be formed in one chip using the chip G. In other words, the previous stage amplification element 12 and a part of the filter band selection portion 60 may be formed in one chip using the chip G.

Additionally, in the present embodiment, although the control IC 11G is not included in the chip G, the control IC 11G may be formed in one chip with the previous stage amplification element 12 and the filter band selection portion 60 using the chip G.

Additionally, as in the fourth variation and fifth variation on the first embodiment, the configuration may be such that the posterior stage amplification element is selected in accordance with the pass band, that is, the configuration may be such that a plurality of the posterior stage amplification elements are arranged.

Additionally, in the present embodiment, the first chip (chip G) is preferably configured of a CMOS, the second chip is preferably configured of GaAs.

In other words, configuring the control IC 11G and the previous stage amplification element 12, to which power handling is not required, of the CMOS makes it possible to manufacture the PA module at a low cost. On the other hand, configuring the posterior stage amplification element 13, in which a power level of the high-frequency transmission signal is high, of a GaAs based material makes it possible to output a high-frequency transmission signal having high quality amplification characteristics and noise characteristics.

Third Embodiment

A PA module according to the present embodiment has a further different configuration from that of the PA module according to the first embodiment in a point that the filter portion 16 is stacked and arranged so as to overlap with at least one of the previous stage amplification element 12, the filter band selection portion, and the posterior stage amplification element 13. Hereinafter, descriptions of the same points in the PA module according to the present embodiment as the PA module according to the first embodiment will be omitted, and the different points will primarily be described.

[3.1 PA Module Configuration]

Figure 8A:
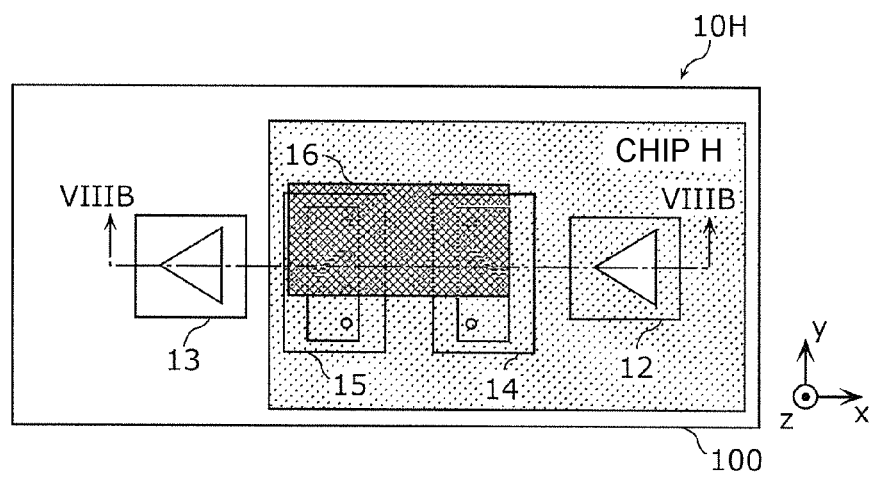
FIG. 8A is a planar configuration diagram of a PA module according to a third embodiment.
Figure 8B:
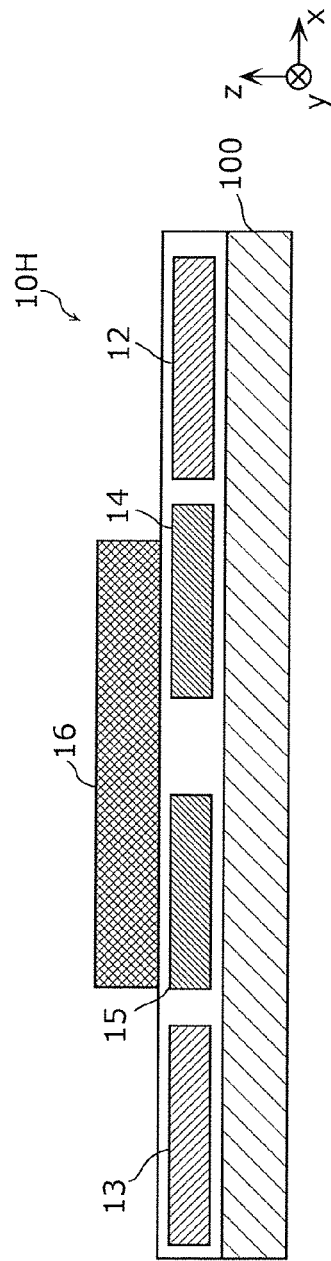
FIG. 8B is a cross-sectional configuration diagram of the PA module according to the third embodiment.

FIG. 8A is a planar configuration diagram of a PA module 10H according to the third embodiment, FIG. 8B is a cross-sectional configuration diagram of the PA module 10H according to the third embodiment. Specifically, FIG. 8B is a cross-sectional view taken by cutting along a VIIIB-VIIIB line in FIG. 8A.

As illustrated in FIG. 8A and FIG. 8B, in the PA module 10H according to the present embodiment, the previous stage amplification element 12, the posterior stage amplification element 13, and the switches 14 and 15 are mounted and arranged on a substrate 100 (in a z-axis direction in the diagram).

Here, in the PA module 10H, the previous stage amplification element 12 and the switches 14 and 15 are formed in one chip using a chip H (first chip). Furthermore, the posterior stage amplification element 13 is included in a chip which is different from the chip H.

Furthermore, in the PA module 10H, the filter portion 16 is mounted and arranged on the switches 14 and 15 (in the z-axis direction). In other words, the filter portion 16 is stacked and arranged (stacked) so as to overlap with the switches 14 and 15 when the substrate 100 is viewed in the plan view.

Examples of the substrate 100 include, in addition to a ceramic substrate, a glass epoxy substrate, a flexible substrate, or the like, an electrode pattern formed on a surface of the substrate 100 and each of the previous stage amplification element 12, the posterior stage amplification element 13, and the switches 14 and 15 are bonded to each other using solder, a bump, or the like. Additionally, in the switches 14 and 15 and the filter portion 16, electrode patterns formed on upper portions of the switches 14 and 15 and an electrode pattern formed on a lower portion of the filter portion 16 are bonded to each other using solder, a bump, or the like.

Note that, in FIG. 8A and FIG. 8B, illustration of wirings connecting the previous stage amplification element 12, the posterior stage amplification element 13, the switches 14 and 15, and the filter portion 16 is omitted.

According to the above-described configuration, by configuring the previous stage amplification element 12 and the posterior stage amplification element 13 using chips which are different from each other, mutual interference of the high-frequency signals can be suppressed. Additionally, by forming the previous stage amplification element 12 and the switches 14 and 15 in one chip using the chip H, in comparison with a case where the previous stage amplification element 12 and the switches 14 and 15 are configured using chips which are different from each other, the size can be reduced. Furthermore, by stacking and arranging the filter portion 16 so as to overlap with the switches 14 and 15 when the substrate 100 is viewed in the plan view, the area of the PA module 10H on the substrate 100 can be reduced. Accordingly, the size can be further reduced while maintaining quality of the high-frequency signal.

[3.2 PA Module Configuration According to First to Third Variations]

Figure 9A:
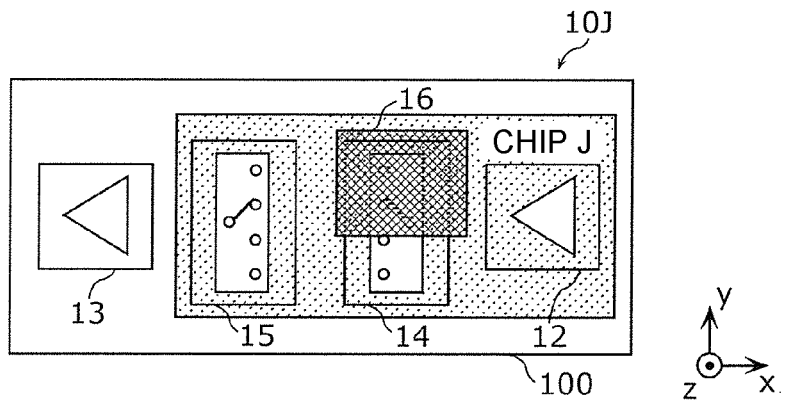
FIG. 9A is a planar configuration diagram of the PA module according to a first variation on the third embodiment.
Figure 9B:
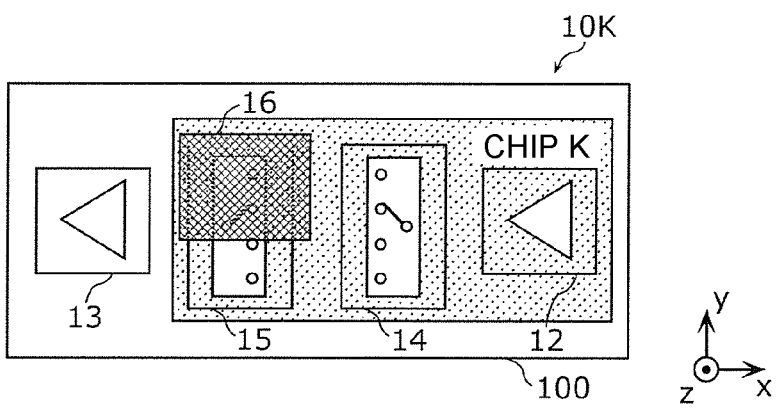
FIG. 9B is a planar configuration diagram of the PA module according to a second variation on the third embodiment.
Figure 9C:
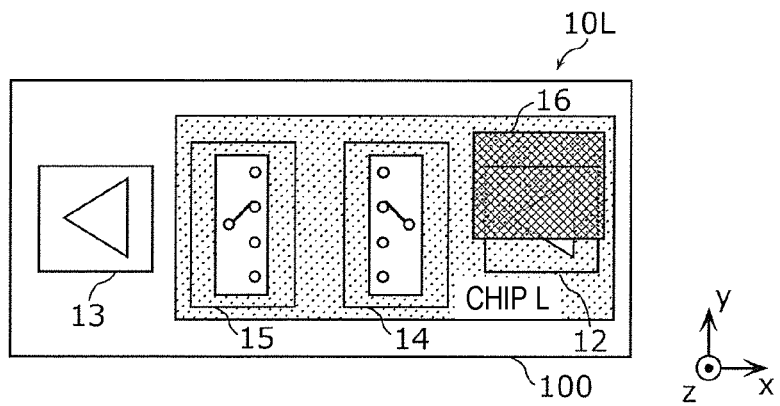
FIG. 9C is a planar configuration diagram of the PA module according to a third variation on the third embodiment.
Figure 10:
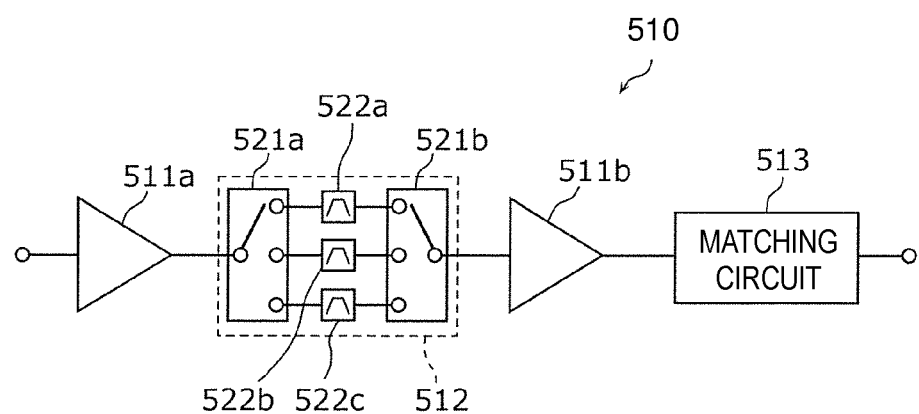
FIG. 10 is a circuit configuration diagram of a PA module disclosed in Patent Document 1.

FIG. 9A, FIG. 9B, and FIG. 9C are planar configuration diagrams of PA modules 10J, 10K, and 10L according to first, second, and third variations on the third embodiment, respectively. The PA modules 10J to 10L according to these variations include the same constituent elements as those of the PA module 10H according to the third embodiment, but are different from the PA module 10H in stacked and arranged modes. Hereinafter, descriptions of each of the constituent elements configuring the PA modules 10J to 10L will be omitted, and the points that are different from the PA module 10H will primarily be described.

As illustrated in FIG. 9A, in the PA module 10J according to the first variation, the previous stage amplification element 12 and the switches 14 and 15 are formed in one chip using a chip J (first chip). Furthermore, the posterior stage amplification element 13 is included in a chip which is different from the chip J.

Furthermore, in the PA module 10J, the previous stage amplification element 12, the posterior stage amplification element 13, and the switches 14 and 15 are mounted and arranged on the substrate 100 (in the z-axis direction in the diagram). Furthermore, the filter portion 16 is mounted and arranged on the switch 14 (in the z-axis direction). In other words, the filter portion 16 is stacked and arranged (stacked) so as to overlap with the switch 14 when the substrate 100 is viewed in the plan view.

Additionally, as illustrated in FIG. 9B, in the PA module 10K according to the second variation, the previous stage amplification element 12 and the switches 14 and 15 are formed in one chip using a chip K (first chip). Furthermore, the posterior stage amplification element 13 is included in a chip which is different from the chip K.

Furthermore, in the PA module 10K, the previous stage amplification element 12, the posterior stage amplification element 13, and the switches 14 and 15 are mounted and arranged on the substrate 100 (in the z-axis direction in the diagram). Furthermore, the filter portion 16 is mounted and arranged on the switch 15 (in the z-axis direction). In other words, the filter portion 16 is stacked and arranged (stacked) so as to overlap with the switch 15 when the substrate 100 is viewed in the plan view.

Additionally, as illustrated in FIG. 9C, in the PA module 10L according to the third variation, the previous stage amplification element 12 and the switches 14 and 15 are formed in one chip using a chip L (first chip). Furthermore, the posterior stage amplification element 13 is included in a chip which is different from the chip L.

Furthermore, in the PA module 10L, the previous stage amplification element 12, the posterior stage amplification element 13, and the switches 14 and 15 are mounted and arranged on the substrate 100 (in the z-axis direction in the diagram). Furthermore, the filter portion 16 is mounted and arranged on the previous stage amplification element 12 (in the z-axis direction). In other words, the filter portion 16 is stacked and arranged (stacked) so as to overlap with the previous stage amplification element 12 when the substrate 100 is viewed in the plan view.

Here, in the posterior stage amplification element 13, since a power level of the high-frequency signal to be amplified is high, a large amount of heat is generated. Accordingly, when the filter portion 16 is arranged in the vicinity of the posterior stage amplification element 13, filter characteristics of the filter portion 16 deteriorate by interference with the above-described high-frequency signal. In contrast, in the PA modules 10J, 10K, and 10L according to the above-described first to third variations, since the filter portion 16 is not stacked and arranged on the posterior stage amplification element 13, the size can be reduced while effectively suppressing the deterioration in the characteristics of the filter portion 16.

Additionally, in the PA modules 10J and 10K according to the above-described first and second variations, furthermore, the filter portion 16 is not also stacked and arranged on the previous stage amplification element 12.

A power level in the previous stage amplification element 12 is not as large as that in the posterior stage amplification element 13, but is larger than those of other high-frequency signals. Accordingly, it is further preferable that the filter portion 16 be not arranged in the vicinity of the previous stage amplification element 12 as well as the posterior stage amplification element 13. According to each configuration of the above-described first and second variations, the filter portion 16 is stacked and arranged so as not to overlap with the posterior stage amplification element 13 or the previous stage amplification element 12 in a plan view, in comparison with the PA module 10L illustrated in FIG. 9C, the size can therefore be reduced without further deteriorating the characteristics of the filter portion 16.

Furthermore, in the PA modules 10J and 10K according to the above-described first and second variations, the filter portion 16 is arranged so as to be closest to the switches 14 and 15 configuring the filter band selection portion, a wiring length of the variable filter circuit can therefore be shortened.

[3.3 Other Variations or the Like]

Note that, in the PA modules 10H to 10L according to the present embodiment and variations thereon, although the previous stage amplification element 12 and the switches 14 and 15 are formed in one chip using the first chip, the switch 14 or 15 may not be included in the first chip.

Additionally, in the PA modules 10H to 10L according to the present embodiment and variations thereon, the control IC 11 may be included in the first chip. With this configuration, the size of the PA module can be further reduced.

Additionally, in the present embodiment and variations thereon, the first chip is preferably configured of a CMOS, and the second chip is preferably configured of GaAs.

In other words, configuring the control IC 11 and the previous stage amplification element 12, to which power handling is not required, of the CMOS makes it possible to manufacture the PA module at a low cost. On the other hand, configuring the posterior stage amplification element 13, in which a power level of the high-frequency transmission signal is high, of a GaAs based material makes it possible to output a high-frequency transmission signal having high quality amplification characteristics and noise characteristics.

Other Embodiments or the Like

Although the power amplification (PA) modules according to the embodiments of the present disclosure have been described above using the embodiments and the variations, the power amplification (PA) modules of the present disclosure are not limited to the above-described embodiments and variations. The present disclosure also encompasses other embodiments that are implemented by combining the desired constituent elements in the above-described embodiments and variations, variations obtained by adding various changes to the above-described embodiments and variations, which are conceived by those skilled in the art, without departing from the gist of the present disclosure, and various apparatuses incorporating the power amplification (PA) module of the present disclosure.

For example, the configurations of the third embodiment and the first to third variations thereon may be applied to the PA module 10G according to the second embodiment.

Additionally, in the power amplification (PA) modules according to the above-described embodiments and variations, other high frequency circuit elements, wirings, and the like may be inserted between paths connecting each circuit element and signal path disclosed in the drawings.

Additionally, as described above, the variable filter circuit included in the power amplification (PA) module may be a filter circuit for attenuation with respect to a reception frequency band. According to such a configuration, in a case where the signal in the reception frequency band is present in the transmission signal component amplified by the previous stage amplification element 12, the signal in the reception frequency band can be attenuated by the variable filter circuit, it is thus possible to prevent the transmission signal from sneaking into the reception circuit.

Additionally, the variable filter circuit may be a filter circuit to attenuate a signal in a frequency band other than a used channel which is used among TV idle channels or/and an IMD noise. According to such a configuration, in a system utilizing the idle channels among the TV channels for other communication, the attenuation can be performed with respect to the frequency of an adjacent channel of the channels to be used, the idle channels of the TV channels can therefore effectively be utilized.

Additionally, the present disclosure may be the front-end circuit 1 including the power amplification (PA) module 10 including the characteristic configurations as described above, the reception amplification circuit (low noise amplifier circuit) 20, and the wave separator (antenna switch) 40 to output the reception signal from the antenna element 2 to the reception amplification circuit (low noise amplifier circuit) 20 and to output the high-frequency signal amplified by the power amplification (PA) module 10 to the antenna element 2 as a transmission signal, in which in the variable filter circuit, the pass band is a transmission band corresponding to a communication band to be used which is selected from a plurality of communication bands, the attenuation band is the reception band corresponding to the communication band to be used.

According to the above-described configuration, the front-end circuit reduced in size can be provided while maintaining quality of the high-frequency transmission signal and the high-frequency reception signal.

Additionally, the present disclosure may be the communication device 200 including the front-end circuit 1 including the characteristic configurations as described above, the RF signal processing circuit 3 to output the high-frequency transmission signal to the front-end circuit 1 and to which the high-frequency reception signal is inputted from the front-end circuit 1, and the baseband signal processing circuit 4 to perform signal processing by converting the high-frequency reception signal received from the RF signal processing circuit 3 to an intermediate frequency signal and to convert an intermediate frequency signal to the high-frequency signal and output the converted signal to the RF signal processing circuit 3.

According to the above-described configuration, the communication device reduced in size can be provided while maintaining quality of the high-frequency transmission signal and the high-frequency reception signal.

Additionally, the control ICs (11, 11C to 11G) according to the present disclosure may be each realized as an IC or an LSI (Large Scale Integration) being an integrated circuit. Additionally, a circuit integration method may be realized by dedicated circuits or a multi-purpose processor. An FPGA (Field Programmable Gate Array) programmable after manufacturing the LSI or a reconfigurable processor whose connection or setting of the circuit cell in the inside of the LSI can be reconfigured may be used. Furthermore, if with advances in semiconductor technology or other derivative technology, a circuit integration technology with which the LSI is replaced appears, functional blocks may of course be integrated using the technology.

The present disclosure can be widely used for communication apparatuses such as a cellular phone or the like as a power amplification module arranged in a multiband/multi-mode-compliant front-end portion.

1 FRONT-END CIRCUIT
2 ANTENNA ELEMENT
3 RF SIGNAL PROCESSING CIRCUIT
4 BASEBAND SIGNAL PROCESSING CIRCUIT
5 DISPLAY PORTION
10, 10A, 10B, 10C, 10D, 10E, 10F, 10G, 10H, 10J, 10K, 10L, 510 PA MODULE (POWER AMPLIFICATION MODULE)
11, 11C, 11D, 11E, 11F, 11G CONTROL IC
12 PREVIOUS STAGE AMPLIFICATION ELEMENT
13 POSTERIOR STAGE AMPLIFICATION ELEMENT
14, 15, 18 SWITCH
16 FILTER PORTION
16G RESONATOR
20 LOW NOISE AMPLIFIER CIRCUIT (RECEPTION AMPLIFICATION CIRCUIT)
30 ANTENNA MATCHING CIRCUIT
40 ANTENNA SWITCH
60 FILTER BAND SELECTION PORTION
100 SUBSTRATE
131, 132, 133, 511a, 511b AMPLIFICATION ELEMENT
161, 162, 163, 164 FILTER ELEMENT
171, 172, 173 TRANSMISSION SIDE FILTER ELEMENT
200 COMMUNICATION DEVICE
512 VARIABLE FILTER CIRCUIT
513 MATCHING CIRCUIT
521a, 521b SWITCH CIRCUIT
522a, 522b, 522c FILTER COMPONENT
601, 602, 603, 604, 605 CAPACITIVE ELEMENT
611, 612, 613, 614, 615 SWITCH ELEMENT

The invention claimed is:

1. A power amplification module comprising:
a previous stage amplification element to amplify a high-frequency signal;
a posterior stage amplification element to amplify the high-frequency signal amplified by the previous stage amplification element;
a variable filter circuit arranged between the previous stage amplification element and the posterior stage amplification element to vary a pass band or an attenuation band in accordance with a frequency band of the high-frequency signal; and
an amplification control portion to control amplification characteristics of the previous stage amplification element and the posterior stage amplification element in accordance with a frequency band of the high-frequency signal,
wherein the variable filter circuit includes
one or more filter elements, and
a filter band selection portion to vary the pass band or the attenuation band of the variable filter circuit by being switched in accordance with the frequency band of the high-frequency signal,
the previous stage amplification element and at least a part of the filter band selection portion are provided in one chip using a first chip,
the posterior stage amplification element is included in a second chip different from the first chip, and
the amplification control portion is included in the first chip.

2. The power amplification module according to claim 1, wherein the one or more filter elements are configured of a plurality of filter elements with the pass bands or the attenuation bands different from one another,
the filter band selection portion includes
a first switch element arranged between the previous stage amplification element and the plurality of filter elements to switch a connection between an output terminal of the previous stage amplification element and each of the plurality of filter elements, and
a second switch element arranged between the posterior stage amplification element and the plurality of filter elements to switch a connection between an input terminal of the posterior stage amplification element and each of the plurality of filter elements, and
the previous stage amplification element and at least one of the first switch element and the second switch element are provided in one chip using the first chip.

3. The power amplification module according to claim 1, wherein the one or more filter elements are a resonator,
the filter band selection portion includes
a plurality of capacitive elements connected to the resonator, and
a plurality of switch elements respectively connected to the plurality of corresponding capacitive elements to switch a connection between at least one of the plurality of capacitive elements and the resonator, the previous stage amplification element, and the posterior stage amplification element, and the previous stage amplification element and at least one group of the plurality of capacitive elements and the plurality of switch elements are provided in one chip using the first chip.

4. The power amplification module according to claim 1, wherein a first wiring connecting the amplification control portion to the previous stage amplification element and a second wiring connecting the previous stage amplification element to the filter band selection portion are provided in the first chip.

5. The power amplification module according to claim 1, wherein the previous stage amplification element, the filter band selection portion, and the posterior stage amplification element are arranged on a mounting surface of a substrate, the one or more filter elements are stacked and arranged so as to overlap with at least one of the previous stage amplification element, the filter band selection portion, and the posterior stage amplification element when the substrate is viewed in a plan view.

6. The power amplification module according to claim 5, wherein the one or more filter elements are stacked and arranged so as to overlap with only at least one of the previous stage amplification element and the filter band selection portion among the previous stage amplification element, the filter band selection portion, and the posterior stage amplification element in the plan view.

7. The power amplification module according to claim 5, wherein the one or more filter elements are stacked and arranged so as to overlap with only the filter band selection portion among the previous stage amplification element, the filter band selection portion, and the posterior stage amplification element in the plan view.

8. The power amplification module according to claim 1, wherein the previous stage amplification element amplifies a high-frequency signal in a frequency range including a plurality of communication bands, the posterior stage amplification element is configured of a plurality of amplification elements respectively corresponding to the plurality of communication bands, and in the posterior stage amplification element, a selected amplification element, among the plurality of amplification elements, corresponding to a communication band to be used among the plurality of communication bands amplifies the high-frequency signal amplified by the previous stage amplification element.

9. The power amplification module according to claim 1, wherein the first chip is configured of a complementary metal oxide semiconductor, and the second chip is configured of GaAs.

10. A front-end circuit comprising:
the power amplification module according to claim 1;
a reception amplification circuit; and
a wave separator to output a reception signal from an antenna element to the reception amplification circuit and to output the high-frequency signal amplified by the power amplification module to the antenna element as a transmission signal.

11. The front-end circuit according to claim 10, wherein in the variable filter circuit, the pass band is a transmission band corresponding to a use communication band selected from a plurality of communication bands, the attenuation band is a reception band corresponding to the use communication band.

12. A communication device comprising:
the front-end circuit according to claim 10;
a radio frequency signal processing circuit to output a high-frequency transmission signal to the front-end circuit and to which a high-frequency reception signal is inputted from the front-end circuit; and
a baseband signal processing circuit to perform signal processing by converting the high-frequency reception signal received from the radio frequency signal processing circuit to an intermediate frequency signal and to convert an intermediate frequency signal to a high-frequency signal and output the converted high-frequency reception signal to the radio frequency signal processing circuit.

13. The power amplification module according to claim 2, wherein the previous stage amplification element, the filter band selection portion, and the posterior stage amplification element are arranged on a mounting surface of a substrate, the one or more filter elements are stacked and arranged so as to overlap with at least one of the previous stage amplification element, the filter band selection portion, and the posterior stage amplification element when the substrate is viewed in a plan view.

14. The power amplification module according to claim 3, wherein the previous stage amplification element, the filter band selection portion, and the posterior stage amplification element are arranged on a mounting surface of a substrate, the one or more filter elements are stacked and arranged so as to overlap with at least one of the previous stage amplification element, the filter band selection portion, and the posterior stage amplification element when the substrate is viewed in a plan view.

15. The power amplification module according to claim 4, wherein the previous stage amplification element, the filter band selection portion, and the posterior stage amplification element are arranged on a mounting surface of a substrate, the one or more filter elements are stacked and arranged so as to overlap with at least one of the previous stage amplification element, the filter band selection portion, and the posterior stage amplification element when the substrate is viewed in a plan view.

16. The power amplification module according to claim 2, wherein the previous stage amplification element amplifies a high-frequency signal in a frequency range including a plurality of communication bands, the posterior stage amplification element is configured of a plurality of amplification elements respectively corresponding to the plurality of communication bands, and in the posterior stage amplification element, a selected amplification element, among the plurality of amplification elements, corresponding to a communication band to be used among the plurality of communication bands amplifies the high-frequency signal amplified by the previous stage amplification element.

* * * * *